United States Patent

Woodward

[15] 3,678,418

[45] July 18, 1972

[54] PRINTED CIRCUIT BALUN

[72] Inventor: Oakley McDonald Woodward, Princeton, N.J.

[73] Assignee: RCA Corporation

[22] Filed: July 28, 1971

[21] Appl. No.: 166,771

[52] U.S. Cl. ....................................333/26, 333/34, 333/35, 333/84 R

[51] Int. Cl. ......................H03h 7/38, H03h 7/42, H01p 3/02

[58] Field of Search .........................333/26, 84, 84 M, 34, 35

[56] References Cited

UNITED STATES PATENTS 2,581,156 1/1952 Weighton.............................333/26 X

*Primary Examiner*—Eli Lieberman
*Assistant Examiner*—Marvin Nussbaum
*Attorney*—Edward J. Norton

[57] ABSTRACT

A printed circuit balun includes a first relatively broad conductor on a first surface of a dielectric substrate which conductor first-mentioned from an unbalanced end of the balun to a point near the opposite balanced end of the balun. On the opposite or second surface of the substrate, there is provided a second conductor that has a first relatively narrow conductor portion spaced directly opposite the first-mentioned broad conductor. The second conductor also has on the second surface a second relatively broad conductor portion parallel to the narrow portion of the second conductor. The second relatively broad conductor portion of the second conductor is coupled at a point near the unbalanced end of the balun through the substrate to the first-mentiondd broad conductor on the first surface of the substrate. The narrow conductor portion of the second conductor is joined to the broad conductor portion of the second conductor near the balanced end of the balun.

6 Claims, 2 Drawing Figures

INVENTOR.
OAKLEY M. WOODWARD
BY Robert L. Troike
ATTORNEY

PRINTED CIRCUIT BALUN

This invention relates to impedance matching devices and more particularly to a balun for matching an unbalanced transmission line to either a balanced transmission line or a balanced antenna.

With the advent of miniaturization in electronics, the antenna system as well as the electronic system used with the antenna are sought to be miniaturized. One way of achieving miniaturization is by the use of printed circuit antennas. Many types of printed circuit antennas are of the balanced type in which two equal width conductors are printed on opposite sides of a dielectric substrate or board. It is therefore desirable that a printed circuit balun be provided in which the balanced end is adapted to connect with two such conductors printed, for example, on opposite sides of an antenna dielectric board. It is further desirable that no crossover connection to the dielectric board be made at the balanced end of the balun.

Briefly, a printed circuit balun for providing a balanced to unbalanced line transition over a desired operating range of frequencies includes a dielectric substrate having two essentially parallel spaced sides. A first conductor on a first side of the substrate extends from the unbalanced to the balanced end of the balun. The first conductor includes a first relatively broad conductor portion. A second conductor on the second, opposite side of the substrate includes a first, second and third portion. The first portion of the second conductor is relatively narrow and is located on the second or opposite side of the substrate parallel with the first conductor to form with the first conductor an unbalanced transmission line. The second portion of the second conductor extends generally parallel to and is spaced from the first portion of the second conductor so as to be out of the electromagnetic coupling region of the unbalanced line. The third portion of said second conductor is a relatively narrow conductor connect at the balanced end of the balun between the first portion and the second portion of the second conductor. Near the unbalanced end of the balun, the second portion of the second conductor is connected to the first conductor through the substrate.

Figure 1:
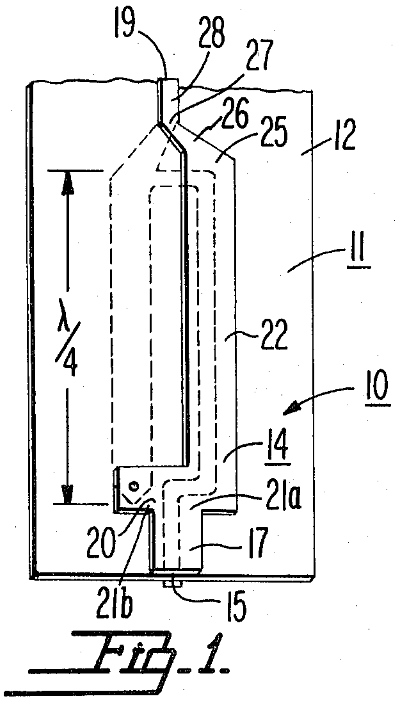
Figure 2:
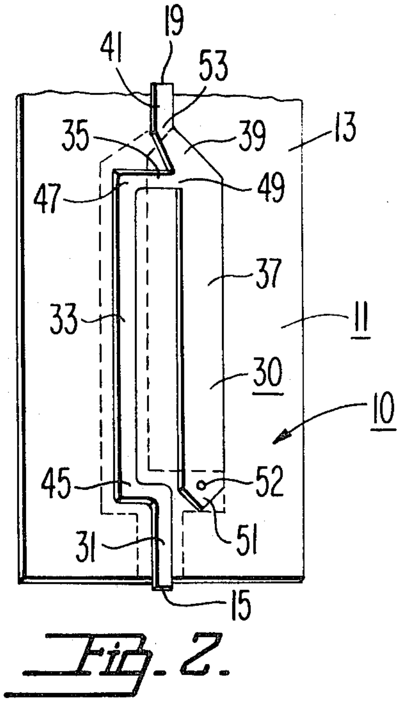

A description of an embodiment of the present invention follows in conjunction with the following drawings wherein:

FIG. 1 is a perspective view of a printed circuit balun in accordance with one embodiment of the present invention, and FIG. 2 is a perspective view taken from the opposite side of the balun shown in FIG. 1.

The balun 10 which provides a transformation between an unbalanced line and a balanced line is provided by the strip-like conductors forming transmission lines on a dielectric substrate 11. The substrate 11 may be alumna, for example. The end 15 of the substrate 11 is the unbalanced end of the balun 10, and the end 19 is the balanced end of the balun 10.

In FIG. 1, a first conductor 14 which extends from the unbalanced end 15 to the balanced end 19 of the balun is fixed to one surface 12 of the substrate 11. The conductor 14 includes a first unbalanced line coupling member 17 that extends from end 15 to point **21*a* and 21*b*, a tab-like member 20 that extends laterally from member 17 at point 21b, a third member 22 that extends from point 21*a* to point 25, a fourth transition coupling member 26 that extends between point 25 and 27, and a fifth balanced line coupling member 28 that extends from point 27 to balanced end 19. The first conductor member 17, the tab-like member 20 and the member 22 are all relatively broad compared to member 28. These conductor members 17, 20 and 22 are, for example, all about three times as wide as member 28. The width of the member 26 tapers between points 25 and 27 with the width of this conductor member 26 tapering from the relatively broad conductor member 22 at point 25 to the relatively narrow (one third width) member 28 at point 27**.

In FIG. 2, a second conductor 30 that extends from the unbalanced end 15 to the balanced end 19 is fixed to the surface 13 of the substrate 11. Conductor 30 is made up of a first unbalanced line coupling member 31, a second member 33, a third member 35, a fourth or parallel member 37, a fifth member 39 and a sixth member 41.

The first member 31 acts with the member 17 of conductor 14 as an unbalanced line input coupling portion and extends from end 15 to point 45. The second member 33 extends from point 45 to point 47. The third member 35 extends from point 47 to point 49. The fourth member 37 is parallel to member 33 and extends from point 49 to free end 51 a distance of one-quarter wavelength at an operating frequency of the balun 10. The fifth member 39 extends from point 49 to point 53, and the sixth member 41 extends from point 53 to balanced end 19. The members 31, 33, 35 and 41 are relatively narrow conductors on the order of one-third the width of the broad conductor members 17, 20 and 22 on the surface 12 of the substrate 11 of the member 37 on the surface 13 of the substrate 11. The conductor member 39 tapers from the relatively broad width of the member 37 at point 49 to the relatively narrow width of member 41 at point 53.

Relatively narrow members 31 and 33 of conductor 30 are spaced on surface 13 of substrate 11 directly opposite and parallel to the broad conductor members 17 and 22 of conductor 14 to form with these conductor members an unbalanced, strip transmission line. Relatively broad conductor member 37 is sufficiently spaced from the narrow conductor members 31 and 33 and from the broad conductor 14 on the opposite surface to the out of the electromagnetic coupling region of the unbalanced transmission line so formed.

Near the balanced end 19 of the balun 10, member 35 of conductor 30 extends between the narrow member 33 at point 47 and the junction 49 of broader members 37 and 39. Point 47 is approximately one-quarter transmission line wavelength at an operating frequency of the balun from point 45.

Near the unbalanced end 15, the free end 51 of broad member 37 of conductor 30 is connected to the tab member 20 of conductor 14 by means of a metallic rivet 52 extending through the substrate 11. This short circuit at the free end 51 of member 37 appears at point 49 a quarter wavelength away as an open circuit. Consequently, this short circuit coupling has little or no effect on the antenna operation, assuming an antenna is coupled to the balanced end 19 of the balun 10. The member 41 of conductor 30 and member 28 of conductor 14 are spaced directly opposite each other to form a balanced transmission line coupling at end 19.

What is claimed is:

1. An improved printed circuit balun for providing a balanced to unbalanced line transition over a desired operating range of frequencies comprising in combination:
   - a dielectric substrate having two essentially parallel spaced sides,
   - a first conductor on a first side of said substrate and extending from the balanced to unbalanced end of said balun, said first conductor including a relatively broad member,
   - a second conductor on the second opposite side of the substrate, said second conductor having first, second and third members, said first member of said second conductor being relatively narrow and spaced parallel to and on that portion of said second opposite side of said substrate directly opposite said first conductor to form with said first conductor an unbalanced transmission line, said second member of said second conductor being relatively broad and extending generally parallel to and spaced from said first member of said second conductor so as to be out of the electromagnetic coupling region of said unbalanced transmission line,
   - said third member of said second conductor being relatively narrow and coupled at the balanced end of the balun between the first member and the second member of said second conductor, said second conductor being directly connected to the first conductor near the open end of the second member of said second conductor.

2. The combination as claimed in claim 1 wherein the relatively broad members have a width on the order of at least three times the width of the relatively narrow members.

3. The combination as claimed in claim 2 wherein the length of said second member of said second conductor is on the order of one-quarter wavelength at an operating frequency of said balun.

4. The combination as claimed in claim 3 wherein said first conductor includes a second and third member, the second member being relatively narrow and extending at one end to the balanced end of said balun and to the third member being coupled between the other end of said first member of said first conductor near the balanced end and the second member, the third member of said in claim 4 wherein said second conductor includes fourth and fifth members located near the balanced end of said balun and on said second opposite surface of said substrate with said fourth member being relatively narrow and being directly opposite said second member of said first conductor to form a balanced transmission line, said fifth member being coupled between the junction of said second and third members of said second conductor and said fourth member of said second conductor with the width of said fifth member being tapered between the relatively broad width of the second member of said second conductor nd the relatively narrow width of said fourth member of said second conductor. first conductor having a width tapering from the relatively broad width of the first member to the relatively narrow width of the second member of said second conductor.

5. The combination as claimed in claim 4 wherein said second conductor includes fourth and fifth members located near the balanced end of said balun and on said second opposite surface of said substrate with said fourth member being relatively narrow and being directly opposite said second member of said first conductor to form a balanced transmission line, said fifth member being coupled between the junction of said second and third members of said second conductor and said fourth member of said second conductor with the width of said fifth member being tapered between the relatively broad width of the second member of said second conductor and the relatively narrow width of said fourth member of said second conductor.

6. The combination as claimed in claim 5 wherein said first conductor includes a fourth relatively broad conductive member at said unbalanced end of said balun and said second conductor includes a relatively narrow sixth member spaced directly opposite said fourth member of said first conductor and being of relatively narrow width to form an unbalanced strip transmission line.

* * * * *

UNITED STATES PATENT OFFICE
CERTIFICATE OF CORRECTION

Patent No. 3,678,418 Dated July 18, 1972

Inventor(s) Oakley McDonald Woodward

It is certified that error appears in the above-identified patent and that said Letters Patent are hereby corrected as shown below:

Column 1, line 35, correct "connect" to read --connected--.

Claim 4, line 7, after "member of said" delete --in claim 4 wherein said--

Claim 4, delete lines 8 - 18.

Claim 4, line 19, delete --said second conductor.--.

Signed and sealed this 2nd day of January 1973.

(SEAL)
Attest:

EDWARD M.FLETCHER,JR.
Attesting Officer

ROBERT GOTTSCHALK
Commissioner of Patents

FORM PO-1050 (10-69)
3530 6|72

USCOMM-DC 60376-P69
☆ U.S. GOVERNMENT PRINTING OFFICE 1969 O—366-334